United States Patent
Muramatsu (10) Patent No.: US 10,524,389 B2
(45) Date of Patent: Dec. 31, 2019

(54) ELECTRONIC DEVICE AND HEAT SPREADER

(71) Applicant: RICOH COMPANY, LTD., Tokyo (JP)

(72) Inventor: Koichi Muramatsu, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/570,590

(22) PCT Filed: May 9, 2016

(86) PCT No.: PCT/JP2016/002269
§ 371 (c)(1),
(2) Date: Oct. 30, 2017

(87) PCT Pub. No.: WO2016/185687
PCT Pub. Date: Nov. 24, 2016

(65) Prior Publication Data
US 2018/0139867 A1 May 17, 2018

(30) Foreign Application Priority Data

May 20, 2015 (JP) ................. 2015-102995

(51) Int. Cl.
*H05K 7/20* (2006.01)
*H05K 1/18* (2006.01)
(Continued)

(52) U.S. Cl.
CPC ....... *H05K 7/20436* (2013.01); *H04N 5/2253* (2013.01); *H05K 1/0203* (2013.01);
(Continued)

(58) Field of Classification Search
CPC ............. H05K 7/20436; H05K 1/0203; H05K 5/0008; H05K 2201/066;
(Continued)

(56) References Cited

U.S. PATENT DOCUMENTS

| 4,563,375 A | 1/1986 | Ulrich |
| 4,997,032 A | 3/1991 | Danielson et al. |

(Continued)

FOREIGN PATENT DOCUMENTS

| DE | 196 24 475 A1 | 1/1998 |
| DE | 100 33 848 A1 | 1/2002 |

(Continued)

OTHER PUBLICATIONS

International Search Report and Written Opinion dated Jul. 19, 2016 in PCT/JP2016/002269 filed on May 9, 2016.

(Continued)

*Primary Examiner* — Hung S. Bui
*Assistant Examiner* — Michael A Matey
(74) *Attorney, Agent, or Firm* — Xsensus LLP (57) ABSTRACT

An electronic device includes: a circuit board with mounted components including a heat-generating electronic element mounted thereon; a casing configured to internally hold the circuit board; and a heat spreader configured to be held in the casing together with the circuit board, the heat spreader being formed by enclosing a liquid or paste-like thermal conductive medium in a flexible package and configured to deform to conform to a three-dimensional shape of the heat-generating electronic element and periphery thereof on the circuit board.

12 Claims, 5 Drawing Sheets

(51) Int. Cl.
  *H05K 5/00* (2006.01)
  *H05K 1/02* (2006.01)
  *H04N 5/225* (2006.01)

(52) U.S. Cl.
  CPC .......... *H05K 1/181* (2013.01); *H05K 5/0008* (2013.01); *H05K 2201/066* (2013.01); *H05K 2201/10121* (2013.01); *H05K 2201/10151* (2013.01)

(58) Field of Classification Search
  CPC .......... H05K 2201/10121; H05K 2201/10151; H04N 5/2253
  See application file for complete search history.

(56) References Cited

U.S. PATENT DOCUMENTS

| | | | | |
|---|---|---|---|---|
| 5,245,508 | A * | 9/1993 | Mizzi | H05K 7/20636 165/185 |
| 5,365,402 | A | 11/1994 | Hatada et al. | |
| 5,812,374 | A * | 9/1998 | Shuff | H05K 7/20545 165/185 |
| 7,486,517 | B2 * | 2/2009 | Aapro | H04M 1/026 165/104.33 |
| 8,879,263 | B2 * | 11/2014 | Gunderson | H05K 5/0256 29/592.1 |
| 2002/0149913 | A1 * | 10/2002 | Nakamura | G06F 1/1616 361/704 |
| 2003/0066672 | A1 * | 4/2003 | Watchko | C23C 4/00 174/50 |
| 2003/0173059 | A1 * | 9/2003 | Edelmann | H05K 7/20454 165/80.2 |
| 2006/0126297 | A1 * | 6/2006 | Belady | G06F 1/189 361/700 |
| 2007/0127217 | A1 * | 6/2007 | Schwarz | H05K 7/20454 361/720 |
| 2010/0263851 | A1 | 10/2010 | Yasui | |
| 2011/0308781 | A1 * | 12/2011 | O'Riordan | H01L 23/3737 165/185 |
| 2013/0050954 | A1 * | 2/2013 | Albrecht, III | H05K 1/0203 361/720 |
| 2014/0043754 | A1 * | 2/2014 | Hartmann | H05K 7/20454 361/679.54 |
| 2014/0252404 | A1 * | 9/2014 | Takayama | C08L 33/08 257/99 |
| 2015/0253823 | A1 * | 9/2015 | Han | G06F 1/203 361/679.52 |
| 2015/0326057 | A1 * | 11/2015 | Koyanagi | H01M 10/46 320/108 |
| 2016/0192541 | A1 * | 6/2016 | Rech | H05K 7/20409 361/709 |
| 2016/0334843 | A1 * | 11/2016 | Uto | G02F 1/133385 |
| 2018/0270943 | A1 * | 9/2018 | Suzuki | H05K 1/0203 |

FOREIGN PATENT DOCUMENTS

| | | |
|---|---|---|
| DE | 10 2007 041 419 A1 | 3/2009 |
| GB | 2310321 | 8/1997 |
| JP | 60-500391 A | 3/1985 |
| JP | 01-128495 A | 5/1989 |
| JP | 06-268113 A | 9/1994 |
| JP | 08-008567 | 1/1996 |
| JP | 08-139235 | 5/1996 |
| JP | 11-097869 | 4/1999 |
| JP | 2003-68952 A | 3/2003 |
| JP | 2012-256792 | 12/2012 |
| JP | 2013-222836 | 10/2013 |
| JP | 5402200 | 11/2013 |
| WO | 2010/036784 | 4/2010 |
| WO | 2014/018491 | 1/2014 |

OTHER PUBLICATIONS

Extended European Search Report dated Mar. 29, 2018 in Patent Application No. 16796083.0, 8 pages.
Japanese Office Action dated Nov. 6, 2018 for Japanese Patent Application No. 2015-102995.
Japanese Office Action dated May 28, 2019, issued in corresponding Japanese Application No. 2015-102995, 2 pages.

* cited by examiner

ELECTRONIC DEVICE AND HEAT SPREADER

TECHNICAL FIELD

The present invention relates generally to electronic devices and heat spreaders.

BACKGROUND ART

A wide variety of "electronic device", such as personal computers and image pickup devices, e.g., digital cameras and video cameras, are known.

Such electronic device is typically structured such that a circuit board, on which "mounted components including an electronic element" are mounted, is held by a casing.

Examples of the mounted components mounted on the circuit board include a heat-generating electronic device, such as a processing chip, that "generates heat when used".

Because the heat-generating electronic element generates heat during operation, if the generated heat is not managed properly, the temperature of the electronic element rises high and can hinder the electronic element from functioning appropriately and/or adversely affect functions of mounted components near the electronic element.

As a method for managing heat generated by a heat-generating electronic element, "a method of conducting generated heat to the outside using a heat conductor, thereby releasing the heat" is known. Such a method is disclosed in patent literature 1 and patent literature 2.

SUMMARY OF INVENTION

Technical Problem

In view of the conventional arts, there is a need to provide novel electronic device provided with a function of managing heat generated by the electronic device.

Solution to Problem

According to exemplary embodiments of the present invention, there is provided an electronic device comprising: a circuit board with mounted components including a heat-generating electronic element mounted thereon; a casing configured to internally hold the circuit board; and a heat spreader configured to be held in the casing together with the circuit board, the heat spreader being formed by enclosing a liquid or paste-like thermal conductive medium in a flexible package and configured to deform to conform to a three-dimensional shape of the heat-generating electronic element and periphery thereof on the circuit board.

Exemplary embodiments of the present invention also provide a heat spreader comprising: a package; and a liquid or paste-like thermal conductive medium enclosed in the package, and configured to deform to conform to a three-dimensional shape of a heat-generating article and periphery thereof.

Advantageous Effects of Invention

According to an aspect of the present invention, novel electronic device provided with a function of managing heat generated by the electronic device can be provided.

DESCRIPTION OF EMBODIMENTS

Exemplary embodiments are described below.

Figure 1:
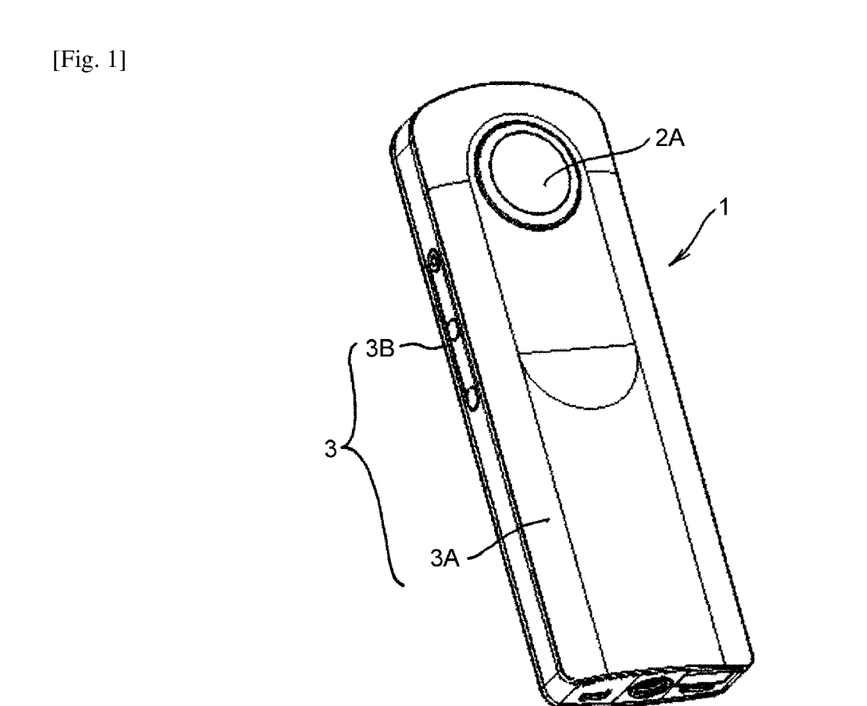
FIG. 1 is an exterior view illustrating an image pickup device according to an embodiment of the present invention.

FIG. 1 is an exterior view of an image pickup device 1.

The portion indicated by reference numeral 2A is "one of lenses included in an image pickup unit".

Reference numeral 3 indicates a "casing". The casing 3 is formed of a partial casing 3A and a partial casing 3B.

Figure 2:
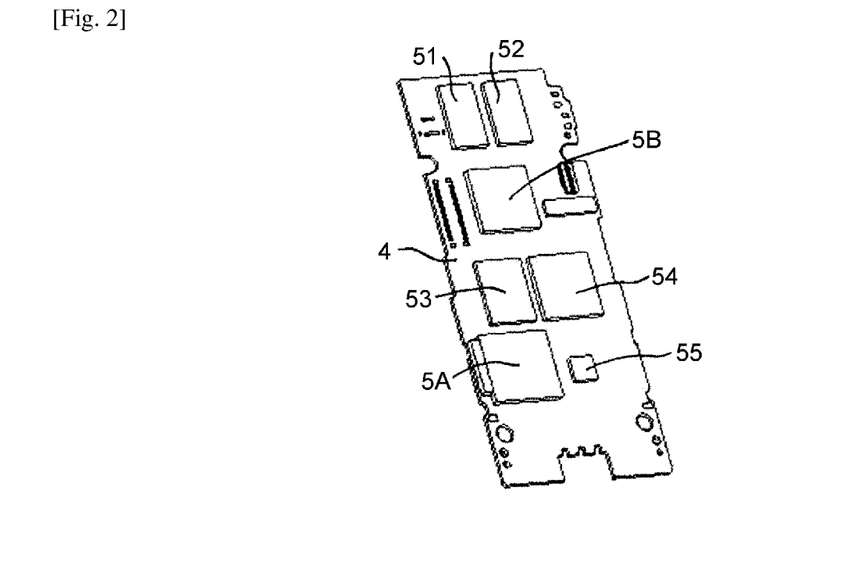
FIG. 2 is a diagram illustrating a circuit board mounted on the image pickup device and mounted components mounted on the circuit board.

FIG. 2 illustrates a circuit board 4, which is mounted on the image pickup device 1, and mounted components 51, 52, 53, 54, 55, and the like mounted on the circuit board 4. These mounted components include processing chips 5A and 5B. Hereinafter, the processing chips 5A and 5B are sometimes referred to as "the processing chip 5A and the like"; the mounted components 51 to 55 and the like are sometimes referred to as "the mounted component 51 and the like".

The mounted component 51 and the like including the processing chip 5A and the like protrude relative to a mount surface of the circuit board 4, thereby assuming an "uneven three-dimensional shape" on the mount surface of the circuit board 4.

Figure 3:
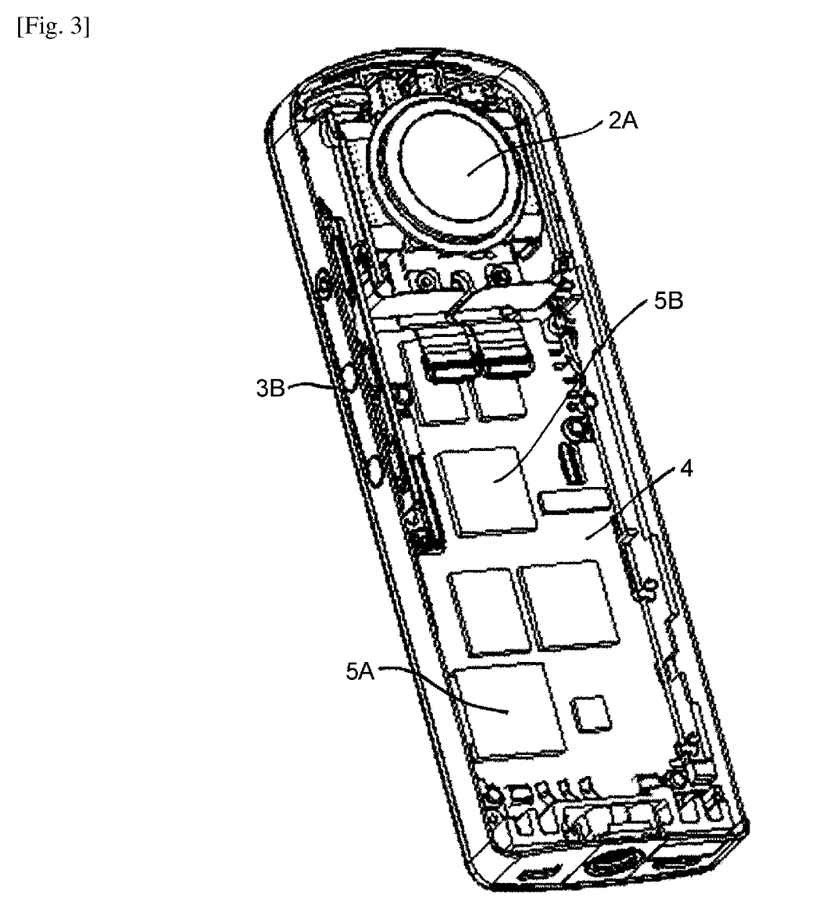
FIG. 3 is a diagram illustrating a state where a partial casing is removed, and an image pickup unit and a circuit board are assembled onto a partial casing and fastened with screws.

FIG. 3 illustrates the casing 3 with the partial casing 3A removed therefrom. The image pickup unit, which includes the lens 2A and the like, and the circuit board 4 are assembled onto the partial casing 3B and fastened with screws.

The processing chip 5A and the like mounted on the circuit board 4 illustrated in FIG. 2 and FIG. 3 generate heat during operation of the image pickup device 1 or, put another way, during image capture. The temperature of the processing chip 5A and the like rises high when duration of the image capture is long.

Accordingly, there is a need for managing the heat generated by the processing chip 5A and the like.

This "thermal management" is performed using the "heat spreader" described below.

Figure 4:
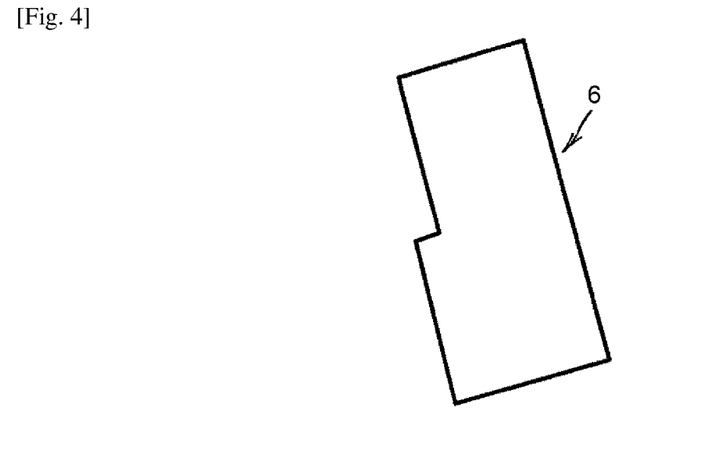
FIG. 4 is a diagram for describing a heat spreader.

FIG. 4 is a diagram illustrating a heat spreader 6.

The heat spreader 6 is shaped in plan view as illustrated in FIG. 4. This shape depends on a "portion where the heat spreader 6 is to be arranged" of the partial casing 3B, onto which the circuit board 4 is assembled.

Figure 5A:
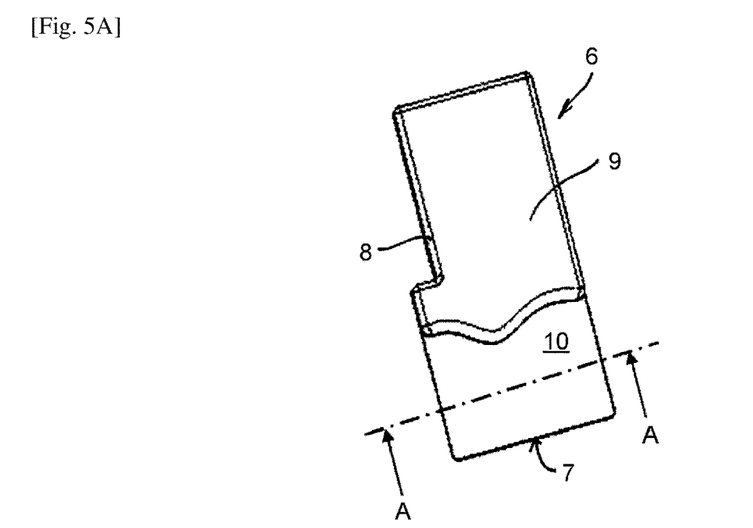
FIG. 5A is a diagram for describing the heat spreader.
Figure 5B:
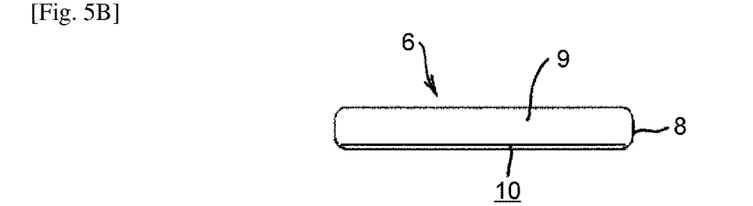
FIG. 5B is a cross-sectional view taken along line A-A of FIG. 5A.

As illustrated in FIGS. 5A and 5B, the heat spreader 6 is formed by enclosing a thermal conductive medium 9 in a package 8. The package 8 is filled with the thermal conductive medium 9 in a manner to leave an unfilled portion, rather than being filled to its capacity. The unfilled portion is deaerated. The portion indicated by reference numeral 10 in FIGS. 5A and 5B indicates a "portion where opposite inner surfaces are sticking to each other" of the deaerated package 8. The thermal conductive medium 9 is absent in this portion.

After filling the package 8 with the thermal conductive medium 9, a portion (an opening) of the package 8 indicated by reference numeral 7 in FIG. 5A is fastened by thermal welding, thereby sealing the inside of the package 8.

Referring to FIG. 5B, which is a cross-sectional view taken along line A-A of FIG. 5A, while the portion filled with the thermal conductive medium 9 is thick, the deaerated portion 10 is thin.

The thermal conductive medium 9 is a liquid or paste-like medium. In the described example herein, the thermal conductive medium 9 is "paste-like".

Although the "paste-like thermal conductive medium" does not have such fluidity as that of liquid, when a mechanical external force is applied, the medium deforms under the external force. The "paste-like thermal conductive medium" deforms like "cosmetic cream".

The package 8 is flexible and "made of thin polyethylene film" in the described example. The thickness of the polyethylene film forming the package 8 is preferably from 0.01 mm to 0.05 mm, for example. In the described example, the thickness is 0.03 mm.

The thermal conductive medium 9 is paste-like and, when a mechanical external force is applied, deforms under the external force. The package 8 is "soft and flexible" because the package 8 is made of the polyethylene film.

Hence, the heat spreader 6 deforms easily under application of an external force.

Figure 6A:
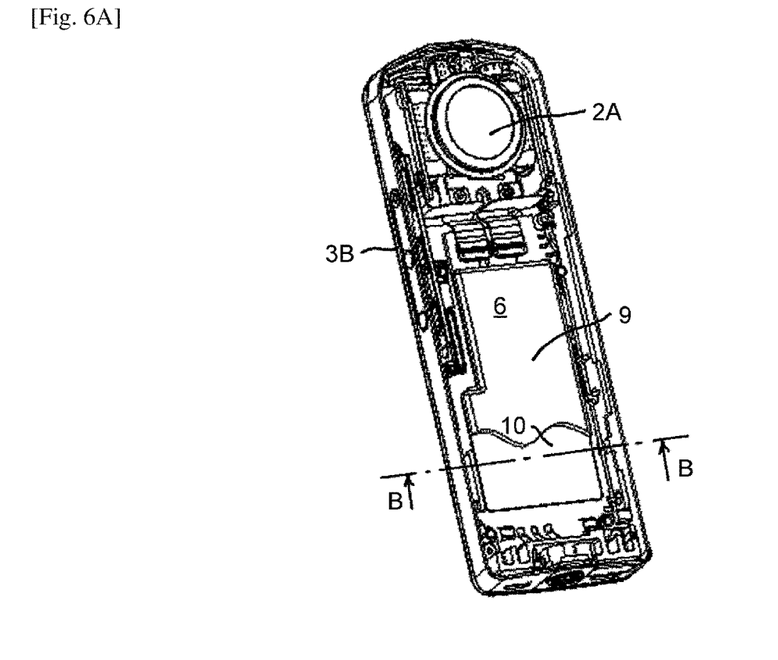
FIG. 6A is a diagram illustrating a state where the heat spreader is placed on the circuit board.
Figure 6B:
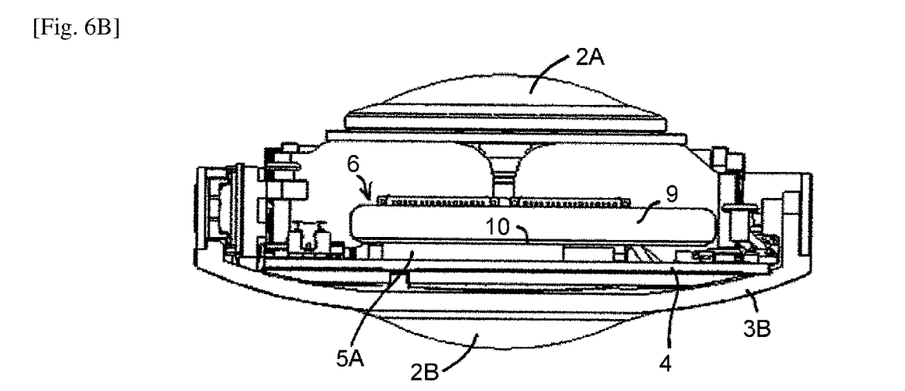
FIG. 6B is a cross-sectional view taken along line B-B of FIG. 6A.

FIGS. 6A and 6B are diagrams illustrating a state where the heat spreader 6 is placed on the circuit board 4. FIG. 6A is a perspective view. FIG. 6B is a cross-sectional view taken along line B-B of FIG. 6A.

In the state illustrated in FIGS. 6A and 6B, the heat spreader 6 is not deformed yet but placed to be planar in form. Referring to FIG. 6B, "a lower one, in FIG. 6B, of surfaces" of the heat spreader 6 is in contact with the processing chip 5A. As a matter of course, the lower surface of the heat spreader 6 is also in contact with the processing chip 5B and the others of the mounted component 51 and the like mounted on the circuit board 4 illustrated in FIG. 3.

Figure 7A:
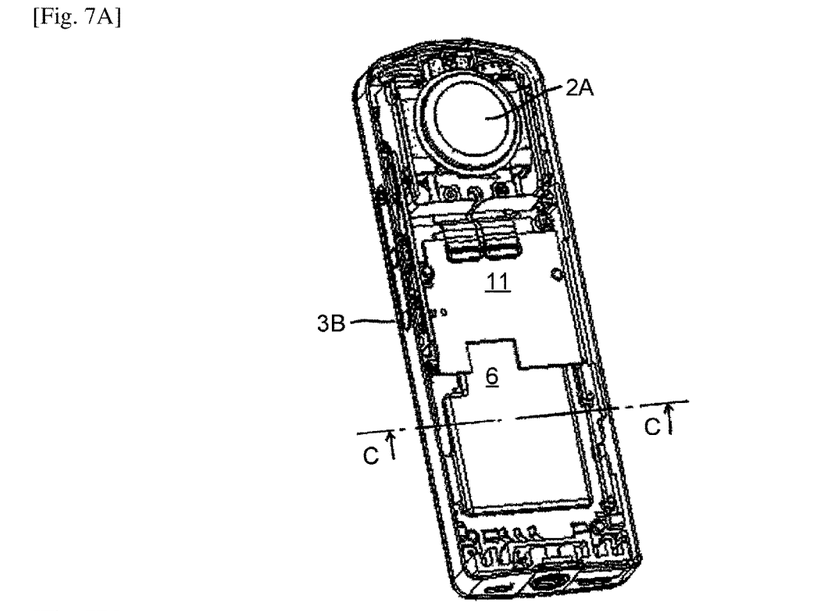
FIG. 7A is a diagram illustrating a state where the heat spreader is placed on the circuit board, and another circuit board is arranged on a surface of the heat spreader on the side opposite from the circuit board.
Figure 7B:
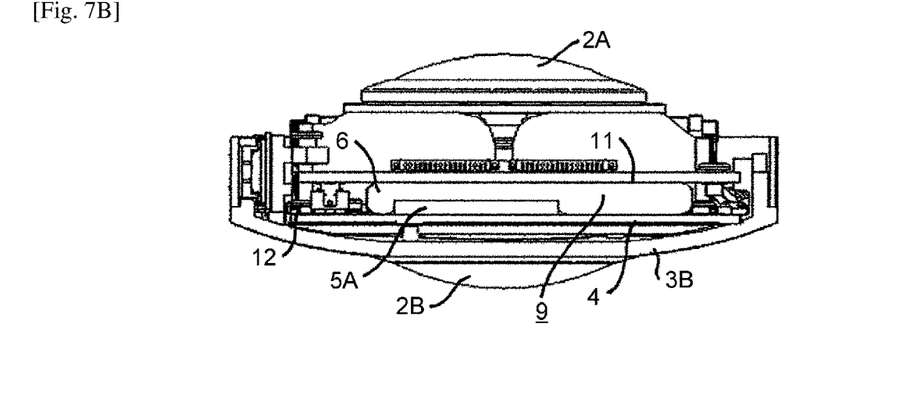
FIG. 7B is a cross-sectional view taken along line C-C of FIG. 7A.

FIGS. 7A and 7B illustrate a state where the heat spreader 6 is placed on the circuit board 4 as illustrated in FIGS. 6A and 6B, and another circuit board 11 is arranged on a surface of the heat spreader 6 on the side opposite from the circuit board 4. FIG. 7A is a perspective view. FIG. 7B is a cross-sectional view taken along line C-C of FIG. 7A.

When the circuit board 11 is assembled onto the casing 3, the circuit board 11 presses the heat spreader 6 in the "thickness direction".

This pressing force "acts as an external force" and moves the paste-like thermal conductive medium 9 in the package 8 of the heat spreader 6. Because of being flexible, the package 8 is deformed to allow the thermal conductive medium 9 to move in the package 8.

As the thermal conductive medium 9 moves inside the package 8, the heat spreader 6 flexibly deforms to conform to a three-dimensional shape of the processing chip 5A and the like, which are heat-generating electronic elements, and their periphery on the circuit board 4 as illustrated in FIG. 7B.

As illustrated in FIG. 7B, the heat spreader 6 contacts not only the processing chip 5A and the like but also a surface portion of the circuit board 4. The heat spreader 6 deforms to conform also to an uneven three-dimensional shape formed with other mounted components mounted on the circuit board 11.

Because the heat spreader 6 deforms to conform to the three-dimensional shape of the processing chip 5A and the like and their periphery in this manner, the heat spreader 6 makes surface contact with portions where the temperature is raised by generated heat. Accordingly, heat from the temperature-rising portions is effectively conducted to the heat spreader 6 and dissipated over the entire heat spreader 6.

Therefore, "heat concentration" at the temperature-rising portions can be effectively prevented, and "a length of time before reaching a high temperature" of the processing chip 5A and the like can be effectively prolonged. Accordingly, the electronic device can operate continuously for a long period of time.

Reference numeral 12 in FIG. 7 indicates a connector connecting between the circuit boards 4 and 11.

A supplementary description about "the image pickup device" described as an example of "the electronic device" is given below.

The image pickup device is a spherical image pickup device. "The image pickup unit", the lens 2A of which is illustrated in FIG. 1, includes not only the lens 2A but also a lens 2B as illustrated in FIG. 6B and FIG. 7B. The lenses 2A and 2B are respectively included two optical systems.

Each of the optical systems including the lens 2A, 2B is a "wide-angle lens whose angle of view is 180 degrees or more". The image pickup unit obtains images formed through these wide-angle lenses. By joining the obtained images, a spherical image is obtained.

In the above description of the embodiment made with reference to FIGS. 7A and 7B, the heat spreader 6 is in direct contact with the heat-generating processing chip 5A and the like. Alternatively, as in the specific example of the embodiment illustrated in FIGS. 8A and 8B, a sheet-type thermal conductor 13 may be interposed between the heat spreader 6 and the heat-generating processing chip 5A and the like.

Figure 8A:
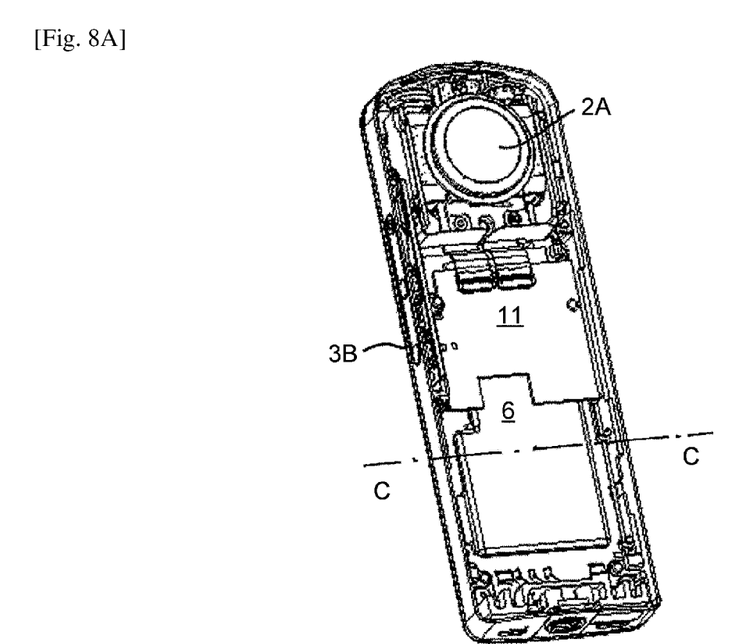
FIG. 8A is a diagram illustrating a specific example of the embodiment, in which a sheet-type thermal conductor is interposed with respect to a heat-generating processing chip.
Figure 8B:
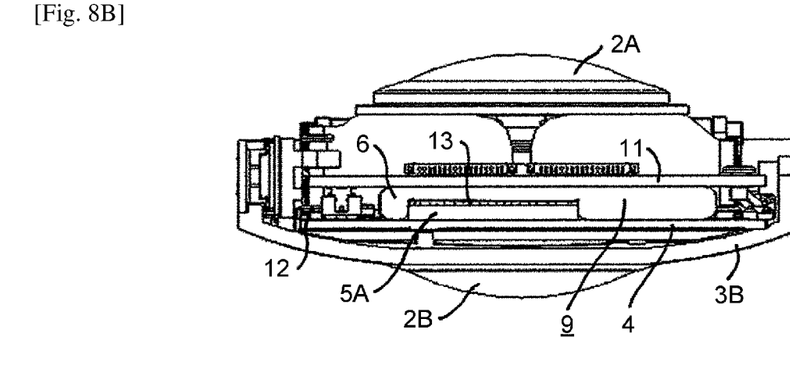
FIG. 8B is a cross-sectional view taken along line C-C of FIG. 8A.

When configured as such, even in a case where the heat spreader 6 cannot be brought into direct contact with the processing chip 5A and the like, it is possible to reliably conduct heat to the heat spreader 6 through the thermal conductor 13.

As the sheet-type thermal conductor 13, an aluminum sheet, a graphite sheet, or the like can be preferably used.

Furthermore, if the size of the sheet-type thermal conductor 13 is set to be larger than "the processing chip 5A and the like", heat generated by the processing chip 5A and the like can be dissipated over a wide area, causing the heat to be transferred to the heat spreader 6 "more preferably".

A supplementary description about the heat spreader 6 is given below.

As described above, the heat spreader 6 makes surface contact with the portions where the temperature is raised by generated heat directly or via the thermal conductor 13, thereby effectively absorbing heat from the temperature-rising portions and dissipating the heat over the entire heat spreader 6.

Therefore, it is preferable that the thermal conductive medium 9 and the package 8 included in the heat spreader 6 have high thermal conductivity and have a large "thermal capacity as the heat spreader 6".

As an example of the material of the package 8, "polyethylene film of 0.03 mm thick" is presented above. However, the material is not limited thereto, and any soft, flexible material having chemical resistance to the thermal conductive medium 9 and heat resistance can be suitably used.

The thermal conductive medium 9 is not limited to the paste-like one illustrated above, and alternatively can be a liquid one. If a liquid thermal conductive medium 9 is used, the heat spreader 6 deforms to conform to the "three-dimensional shape on the board" under its own weight when the heat spreader 6 is simply placed on the board.

Because the thermal conductive medium 9 causes thermal conduction also by convection, the thermal conductive medium 9 can efficiently dissipate heat absorbed from the temperature-rising portions over the entire heat spreader 6.

As the liquid thermal conductive medium 9, alcohol, water, glycerin, or the like can be preferably used. Alternatively, one of various sols, such as hydrosol, organosol, and alcosol, can be used.

The heat spreader 6 according to the embodiment is flexible and therefore does not require a large external force to be "deformed to conform to the three-dimensional shape on the board". Therefore, because deformation of the heat spreader does not involve application of an excessively large mechanical force to the electronic elements and the like, damages to the electronic elements and the like will not occur.

Furthermore, because the thermal conductive medium 9 is enclosed in the package 8, favorable repair workability is provided. Specifically, the thermal conductive medium 9 can be taken out easily in one piece with the package 8 at repair.

Because the heat spreader 6 deforms to conform to the three-dimensional shape on the board, causing the thermal conductive medium 9 to spread all over the package 8, it is possible to load "a maximum fillable amount of the thermal conductive medium" in the electronic device.

When built into the electronic device, the heat spreader 6 deforms to conform to the three-dimensional shape on the circuit board. However, after once built in and deformed, the heat spreader will not deform any more. Accordingly, the heat spreader is not required to be "capable of deforming" after being built in.

In the specific example of the embodiment described above, as the paste-like thermal conductive medium, a thermal conductive medium "made from a plurality of kinds of materials and hardens with time" is used.

Specifically, CGW-3 (trade name) manufactured by Polymatech Group is used as the thermal conductive medium. This thermal conductive medium is a mixture of two different grease-type materials, which are silicone and aluminum oxide, and aluminum hydroxide to which an additive is added.

Hereinafter, the two grease-type materials are referred to as a material A and a material B. The materials A and B differ in "viscosity" such that viscosity of the material A is 490, while viscosity of the material B is 420.

The material A and the material B are mixed at a mixture ratio of 1 to 1 to yield a mixture whose viscosity is 470.

The thermal conductive medium, which is the mixture of the material A and the material B, hardens in approximately five hours into a solid.

Even after hardened in this manner, thermal properties including thermal conductivity do not change.

As a matter of course, after mixed, the thermal conductive medium is enclosed in the paste-like state in the package and mounted on the circuit board.

Use of a thermal conductive medium that hardens into a solid in this manner is advantageous in that, even in a case where "the package should be damaged", the thermal conductive medium will not leak inside the casing.

The thermal conductivity of the thermal conductive medium is 3 W/(m·K) both in the paste-like state and in the hardened state, which is approximately six times as high as the thermal conductivity of "water". Hence, the thermal conductive medium has high thermal conductivity.

As described above, according to aspects of the present invention, the following electronic device and heat spreader can be provided.

Aspect 1

The electronic device 1 including the circuit board 4, 11, on which mounted components including the heat-generating electronic element 5A and the like are mounted, the casing 3 internally holding the circuit board 4, 11, and the heat spreader 6 held in the casing together with the circuit board. The heat spreader 6 is formed by enclosing the liquid or paste-like thermal conductive medium 9 in the flexible package 8 and configured to deform to conform to the three-dimensional shape of the heat-generating electronic element 5A and the like and periphery thereof on the circuit board.

Aspect 2

The electronic device according to Aspect 1, in which the heat spreader 6 makes direct contact with at least the heat-generating electronic element 5A and the like.

Aspect 3

The electronic device according to Aspect 1, in which the heat spreader 6 makes contact, via the sheet-type thermal conductor 7, with at least the heat-generating electronic element 5A and the like.

Aspect 4

The heat spreader 6 including the flexible package 8 and the liquid or paste-like thermal conductive medium 9 enclosed in the package 8. The heat spreader 6 is configured to deform to conform to a three-dimensional shape of a heat-generating article and periphery thereof.

Aspect 5

The heat spreader according to Aspect 4, in which the thermal conductive medium 9 enclosed in the package 8 is liquid.

Aspect 6

The heat spreader according to Aspect 4, in which the thermal conductive medium 9 enclosed in the package 8 is paste-like.

Aspect 7

The heat spreader according to Aspect 6, in which the paste-like thermal conductive medium 9 is made from a plurality of kinds of materials and hardens with time.

Aspect 8

The heat spreader according to any one of Aspects 4 to 7, used in the electronic device according to any one of Aspect 1 to 3.

Aspect 9

The electronic device according to any one of Aspect 1 to 3, including the image pickup unit including the lenses 2A and 2B and configured as the image pickup device 1.

Although the invention has been described with respect to the preferred embodiments, the present invention not limited to the above-described specific embodiments but are to be construed as encompassing all modifications and alternative constructions that fall within the scope of the invention set forth in the appended claims unless otherwise specifically specified in the above description.

For instance, the opening 7 of the heat-releasing package 6 may be configured as "a zipper-like opening (as in a Ziploc (registered trademark) bag)" so as to be reclosable. When configured as such, the package can be sealed easily after being filled with the thermal conductive medium and, furthermore, replacement of the thermal conductive medium is facilitated.

The advantages described above in the embodiments of the invention are only illustrative of favorable advantages provided by the invention, and advantages of the invention are not limited to "those described in the embodiments".

REFERENCE SIGNS LIST

1 Image pickup device
3A and 3B Partial casings (that form a casing)
4, 11 Circuit board
5A, 5B Processing chip (Heat-generating electronic element)
6 Heat spreader
8 Package
9 Thermal conductive medium

CITATION LIST

Patent Literature

PTL 1: Japanese Laid-open Patent Publication No. H11-97869
PTL 2: Japanese Patent No. 5402200

The invention claimed is:

1. A camera, An electronic device comprising:
a first circuit board with mounted components including a heat-generating electronic element mounted thereon;
a second circuit board that faces the first circuit board;
a casing configured to internally hold the first circuit board and the second circuit board;
a heat spreader configured to be held between the first circuit board and the second circuit board; and
two lenses, at the casing, facing in opposite directions, wherein a line extending perpendicularly through a face of one of the two lenses also extends through another of the two lenses,
wherein:
the heat spreader includes a liquid or paste-like thermal conductive medium entirely enclosed in a flexible package and is configured to deform to conform to a three-dimensional shape of the heat-generating electronic element and periphery thereof on the first circuit board.

2. The camera according to claim 1, wherein the heat spreader makes direct contact with at least the heat-generating electronic element.

3. The camera according to claim 1, wherein the heat spreader makes contact, via a sheet-type thermal conductor, with at least the heat-generating electronic element.

4. The camera according to claim 1, wherein the thermal conductive medium enclosed in the package is liquid.

5. The camera according to claim 1, wherein the thermal conductive medium enclosed in the package is paste-like.

6. The camera according to claim 1, wherein the paste-like thermal conductive medium is made from a plurality of kinds of materials and hardens with time.

7. The camera according to claim 1, including an image pickup unit including a lens and configured as an image pickup device.

8. The camera according to claim 1, wherein the package is a polyethylene film.

9. The camera according to claim 1, wherein the package is partially filled by the liquid or paste-like thermal conductive medium and an unfilled portion of the package is deaereated.

10. The camera according to claim 1, wherein the second circuit board presses the package in a thickness direction to flexibly deform the liquid or paste-like thermal conductive medium.

11. The camera according to claim 1, further comprising:
a sheet-type thermal conductor between the heat spreader and the heat-generating electronic element,
wherein an area of the sheet-type thermal conductor larger than an area of the heat-generating electronic element.

12. The camera according to claim 1, wherein the lenses are at least one quarter of a width of a corresponding surface of the electronic device at which the lenses are disposed.

* * * * *